US007350124B2

(12) United States Patent
Gloekler et al.

(10) Patent No.: US 7,350,124 B2
(45) Date of Patent: Mar. 25, 2008

(54) METHOD AND APPARATUS FOR ACCELERATING THROUGH-THE PINS LBIST SIMULATION

(75) Inventors: Tilman Gloekler, Gaertringen (DE);
Christian Habermann, Stuttgart (DE);
Naoki Kiryu, Austin, TX (US);
Joachim Kneisel, Berlin (DE);
Johannes Koesters, Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 11/252,512

(22) Filed: Oct. 18, 2005

(65) Prior Publication Data

US 2007/0089004 A1    Apr. 19, 2007

(51) Int. Cl.
*G06F 11/00* (2006.01)
(52) U.S. Cl. .................. 714/741; 714/733; 714/724; 714/726; 714/727; 714/729; 714/738; 703/13; 703/15; 716/4; 716/18
(58) Field of Classification Search .................. None
See application file for complete search history.

(56) References Cited

U.S. PATENT DOCUMENTS

| | | | |
|---|---|---|---|
| 4,071,902 A | | 1/1978 | Eichelberger et al. |
| 4,963,824 A | * | 10/1990 | Hsieh et al. ............ 324/763 |
| 5,633,812 A | * | 5/1997 | Allen et al. ............ 703/15 |
| 6,351,789 B1 | * | 2/2002 | Green ................ 711/128 |
| 6,516,432 B1 | * | 2/2003 | Motika et al. ........... 714/732 |
| 6,922,803 B2 | * | 7/2005 | Nakao et al. ............ 714/738 |

OTHER PUBLICATIONS

IBM Disclosure NNRD430181, "Scanning Using On-Product Clock Generation", Feb. 1, 2000.*
IBM Disclosure NN9801163, Diagnosis of LBIST and WRPT Through Conversion to Stored Patterns, Jan. 1, 1998.*
Hakmi et al., "Implementing a Scheme for External Deterministic Self-Test", May 5, 2005, IEEE VLSI Symposium, pp. 101-106.*

* cited by examiner

*Primary Examiner*—John P Trimmings
(74) *Attorney, Agent, or Firm*—Francis Lammes; Stephen J. Walder, Jr.; D'Ann N. Rifai

(57) ABSTRACT

The present invention provides a method, an apparatus, and a computer program product for applying external clock and data patterns for TTP-LBIST. A simulation model for the logic under test is set up in a simulator. Next, a user sets up an external LBIST block, which comprises pre-verified internal clock and data pattern logic, and connects this block to the logic in the simulation model. The internal clock and data pattern logic provides the input patterns used in OPCG modes of LBIST. This internal clock and data pattern logic is already verified through the design effort. Therefore, the internal pattern generators become the external pattern generators in the simulation model. The external LBIST block applies the external clock and data patterns, and subsequently, the user receives and processes these output patterns to determine if the logic operates correctly.

6 Claims, 3 Drawing Sheets

METHOD AND APPARATUS FOR ACCELERATING THROUGH-THE PINS LBIST SIMULATION

FIELD OF THE INVENTION

The present invention relates generally to through-the-pins LBIST, and more particularly, to a method to accelerate and simplify the verification of LBIST with external generation of clock or data patterns.

DESCRIPTION OF THE RELATED ART

Modern chip designs contain extensive elaborated circuitry for logic built-in self test ("LBIST"). LBIST refers to the ability of applying clock patterns and/or data patterns to a set of logic on a chip and capturing the corresponding output. By applying the correct patterns and receiving the anticipated outputs, a user can verify that the specific set of logic is functioning correctly. The self test can be executed in different modes, using either internal ("OPCG" which represents on-product clock generation) or external ("TTP" which represents through-the-pins) generation of clock and data patterns. The external generation mode provides a broader range for testing because special clock and data patterns can be applied, which can not be produced internally. The proper operation of TTP-LBIST is important because this type of testing dominates in the manufacturing stage of chips. The self test must be performed in all modes of operation to verify that the logic functions correctly. This is done by simulating several iterations of LBIST and executing a test case with the simulation model of the chip or logic design-under-test.

FIG. 1 is a block diagram of conventional LBIST circuitry 100. Target logic 110 is the logic under the test. For this example, LBIST circuitry 100 exists in a simulation model. A simulation model is a computer program representation of the logic to be tested. LBIST satellite 0 102 generates test vectors that are applied to target logic 110. LBIST satellite N-1 104 generates test vectors for another set of target logic. Several LBIST satellites can cover all of the target logic in a chip or circuit design.

Sender block 106 and receiver block 108 are internal components in the simulation model. Sender block 106 generates the data patterns that are fed into target logic 110. PRPG (pseudo-random pattern generator) 112, PSSB (phase shift and spreader block) 114, and PCWS (programmable channel weight selector) 118 internally provide a weighted pseudo-random pattern sequence with a reduced effect of structural and linear dependencies to the inputs of target logic 110. Accordingly, PRPG 112 produces a pseudo-random data pattern, PSSB 114 scrambles and shifts the data pattern, and PCWS 118 tweaks the distribution of 0s and 1s to ensure that the outputs of target logic 110 can be properly observed. MUX-D 116 selects the internal data patterns from PSSB 114 or the external data input patterns from 122. The internal data patterns refer to OPCG and the external data patterns refer to TTP. A preset simulation input (not shown) controls MUX-D 116 to select the internal data patterns or the external data patterns. Accordingly, the mode setting (TTP or OPCG) depends on chip pin settings that are applied by the test case at the beginning of the simulation.

External data inputs 122 depict the external data input patterns that must be developed in conjunction with the external clock signal patterns to provide the TTP self test. The generation of these external data patterns and the corresponding external clock signal patterns can be time-consuming and error-prone. LBIST controller 126 produces the internal clock signal patterns 126. External clock inputs 124 depict the external clock signal input patterns. MUX-C 128 selects the internal clock patterns from LBIST controller 126 or the external clock patterns from 124. The output 130 of MUX-C 128 provides the clock signal patterns for input to sender block 106, receiver block 108, and target logic 110 during the self test. The internal clock patterns refer to OPCG and the external clock patterns refer to TTP. Once again, a preset simulation input (not shown) controls MUX-C 128 to select the internal clock patterns or the external clock patterns. These clock signal patterns act as control signals for the components within LBIST satellite 0 102 and target logic 110.

Receiver block 108 processes the resulting output patterns of target logic 110. MISR 132 (multiple-input shift register) accumulates the target output patterns and SCB 134 (space compactor block) reduces the number of signal lines to provide the results of the test.

Both LBIST controller 126 and sender block 106 are active in OPCG-LBIST, where data and clock patterns are generated internally. MUX-C 128 routes the clock patterns from LBIST controller 126 to the input clock lines 130. For external data generation, the test case provides the data patterns at the chip input pins and MUX-D 116 routes the data patterns to target logic 110. For external clock generation, the test case provides the external clock inputs 124 at the chip input pins and MUX-C 128 routes the clock patterns to the input clock lines 130. LBIST circuitry 100 supplies the conventional means for internal LBIST (OPCG) and external LBIST (TTP).

During LBIST with internal data and clock generation, PRPG 112, PSSB 114, and LBIST controller 126 are active, along with receiver block 108. Hence, verification of this mode is not difficult. In the test case a user sets up the initial values of the LBIST satellite sender parts 106 and the internal LBIST controller 126. Then the design executes the self test without further interaction with the test case. For LBIST modes with external pattern generation, either PRPG 112 and PSSB 114 or LBIST controller 126 and the former two are quiet. Accordingly, TTP LBIST can involve only applying external data inputs 122, or applying both external data inputs 122 and external clock inputs 124. The user applies the data and/or clock patterns through the chip input pins.

Logic verification faces a problem with the TTP-LBIST modes that require external clock pattern generation or both external clock and data pattern generation. The complex sequences of stimuli must be provided by the test case, which can be described as a set of clock and/or data patterns applied to test the simulation model. In every cycle, the test case needs to change the necessary external clock control signals, or needs to provide a new random pattern data and change the external clock control signals. Therefore, for each cycle the test case must establish a communication with the simulation model and simulator. There are multiple disadvantages with this approach:

1) Testing requires frequent interaction between the test case and the simulation model, thus decreasing the simulation speed intolerably.
2) Due to the frequent interaction, hardware accelerators or emulators do not provide the usual benefit. Hardware accelerators and emulators are commonly known in the art.
3) The development of pattern and clock generation mechanism in the test case is time-consuming and error-prone. Without this mechanism, simulating LBIST operation with external pattern generation is not possible.

4) To limit the development effort, generators in the test case are typically very simple. They provide different data and clock sequences than internal clock and data generation circuitry. Hence, results and coverage in the different LBIST modes cannot be compared.

In the verification of some functions of the logic, the use of additional oscillators as part of the simulation model can alleviate some of these problems by reducing the interaction between the test case and the simulator. For the complex data and clock patterns required for LBIST, this resulting reduction is negligible. Accordingly, LBIST does not gain an advantage from built-in oscillators. Therefore, there is a need to accelerate and simplify the verification of LBIST with external generation of clock or data patterns (TTP-LBIST).

SUMMARY OF THE INVENTION

The present invention provides a method, an apparatus, and a computer program product for applying external clock and data patterns for TTP-LBIST. A simulation model for the logic under test is set up in a simulator. Next, a user sets up an external LBIST block, which comprises pre-verified internal clock and data pattern logic, and connects this block to the logic in the simulation model. The internal clock and data pattern logic provides the input patterns used in OPCG modes of LBIST. This internal clock and data pattern logic is already verified through the design effort. Therefore, the internal pattern generators of the logic under test become the external pattern generators in the simulation model. The external LBIST block applies the external clock and data patterns, and subsequently, the user receives and processes these output patterns to determine if the logic operates correctly.

In one embodiment, the external LBIST block contains at least one PRPG, at least one PSSB, and at least one LBIST controller clock pattern generator. The LBIST controller clock pattern generator provides the clock control signal patterns to the PSSB and the PRPG. The external LBIST block can provide only the external clock pattern inputs to the logic under test, or it can provide the external data pattern inputs and the external clock pattern inputs to the logic under test. Accordingly, when only the external clock pattern inputs are provided, a user must disable the PSSB and the PRPG.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are implemented in hardware in order to provide the most efficient implementation. Alternatively, the functions may be performed by a processor such as a computer or in a data processing system in accordance with code such as computer program code, software, and/or integrated circuits that are coded to perform such functions, unless indicated otherwise.

The present invention accelerates and simplifies the verification of LBIST with external generation of clock or data patterns (TTP-LBIST). The generation of external clock and data patterns is shifted from the test case to the simulation model. Accordingly, pre-verified parts of the design-under-test are instantiated as an external component within the simulation model and connected to the design-under-test. The external component is the stimulus generator for data and clock patterns in TTP-LBIST modes. It replaces a software generator in the test case. The pre-verified parts are those that generate the internal clock and data patterns for the OPCG-LBIST modes. Hence, identical patterns can test different LBIST modes.

Figure 1:
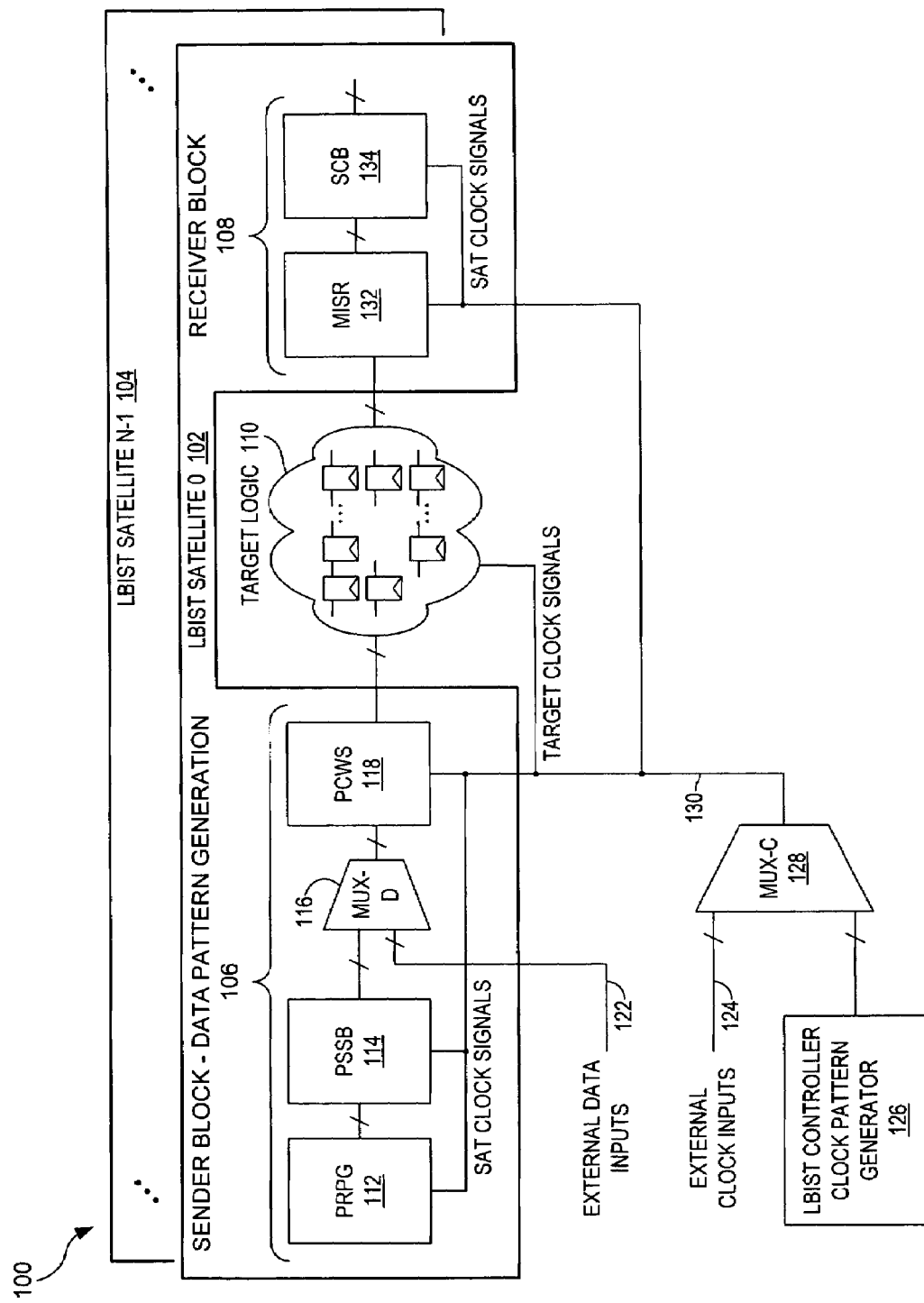
FIG. 1 is a block diagram of conventional LBIST circuitry.
Figure 2:
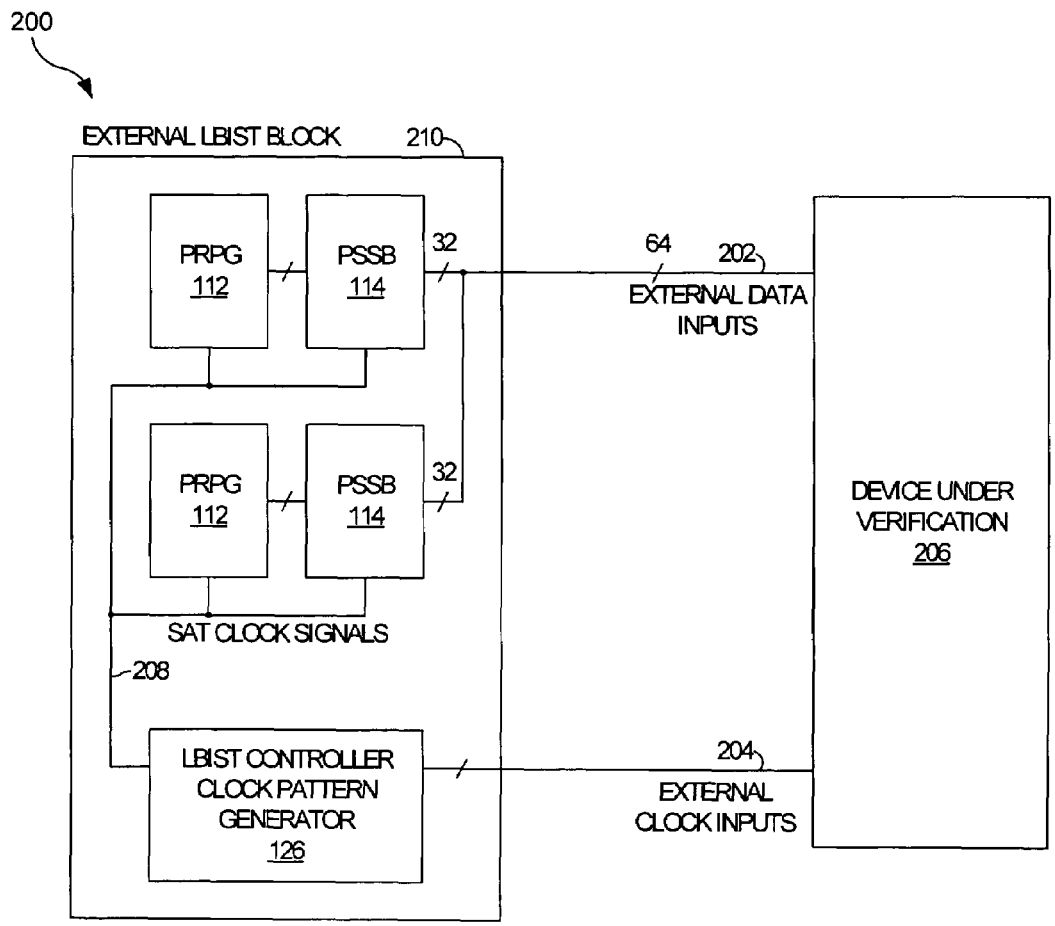
FIG. 2 is a block diagram of the external LBIST block used as the stimulus generator.

FIG. 2 is a block diagram 200 of the external LBIST block 210 used as the stimulus generator. The external LBIST block 210 contains two PRPGs 112 and two PSSBs 114. The PRPGs 112 and PSSBs 114 are the same components as shown in FIG. 1. In conjunction, these components 112, 114 provide a pseudo-random data pattern sequence to the device under verification 206, which can also be called the design-under-test. Accordingly, the external data inputs 202 are the pseudo-random data pattern sequences. The number of PRPGs 112 and PSSBs 114 is adjustable for the amount of bits for the external data inputs 202. Accordingly, two sets of PRPG 112 and PSSB 114 that produce 32 bit data patterns are necessary to produce 64 bit data patterns.

LBIST controller 126 is the same component as shown in FIG. 1. LBIST controller 126 provides the clock signal patterns to the other components of the external LBIST block 210 through communication channel 208 and provides the external clock inputs 204 to the device under verification 206. The receiver block 108 in FIG. 1 is not shown in FIG. 2, but there can be a receiver block 108 from the LBIST satellite 102 to process the resulting output patterns of the device under verification 206. Alternatively, a user can process the target results outside of the device by externally scanning these results. As shown in FIG. 2, external LBIST block 210 contains the components necessary for the internal generation of clock and data patterns (OPCG) in FIG. 1. The difference is that external LBIST block 210 provides the necessary clock and data patterns for external generation of clock and data patterns (TTP). Accordingly, the internal stimulus generators of the design-under-test, which are already verified, are the external stimulus generators within the simulation model. This design 200 simplifies testing of all LBIST modes that require externally generated clock patterns or clock and data patterns.

There are many advantages of the present invention. The configuration of external LBIST block 210 saves the development effort for the stimulus generator in the test case because the design itself is reused. The simulation of TTP-LBIST modes is greatly accelerated, since the interaction between test case and simulator are reduced mainly to the set up of external LBIST block 210. The amount of interaction is now similar to the modes of LBIST with internal clock and data generation. The stimulus generator (LBIST block 210) is a part of the simulation model and is subject to all optimizations that are usually applied when the model is built and simulated, which saves more user and simulation resources. Due to the limited interaction between the test case and the simulation model, the tests allow for efficient simulation on hardware accelerators or emulators.

The development effort for the external LBIST block 210 only includes wiring blocks that have been verified at unit-level and connection errors are easy to find. It is therefore less error-prone than writing a software generator. Due to the elaborated generator, the quality of the data patterns is much higher than what a software generator commonly used in a test case can produce. The shape and the quality of the data and clock patterns are identical for all modes of operation, which implies that the test coverage is the same in all modes. Furthermore, LBIST tests with internal and external pattern generation can be run with identical patterns, thus enabling comparison of most target multiple-input shift register signatures in the different modes of operation. The present invention also enhances the ability to compare LBIST results with results of the hardware tester in bring-up or silicon-debug, as long as the hardware tester executes test patterns that the stimulus generator can produce.

According to the requirements of the LBIST mode, the user can disable parts of the external LBIST block 210. If only the clock signal patterns have to be provided externally, the user turns off the PRPG 112 and PSSB blocks 114. In OPCG mode the user can disable the whole external LBIST block 210.

Figure 3:
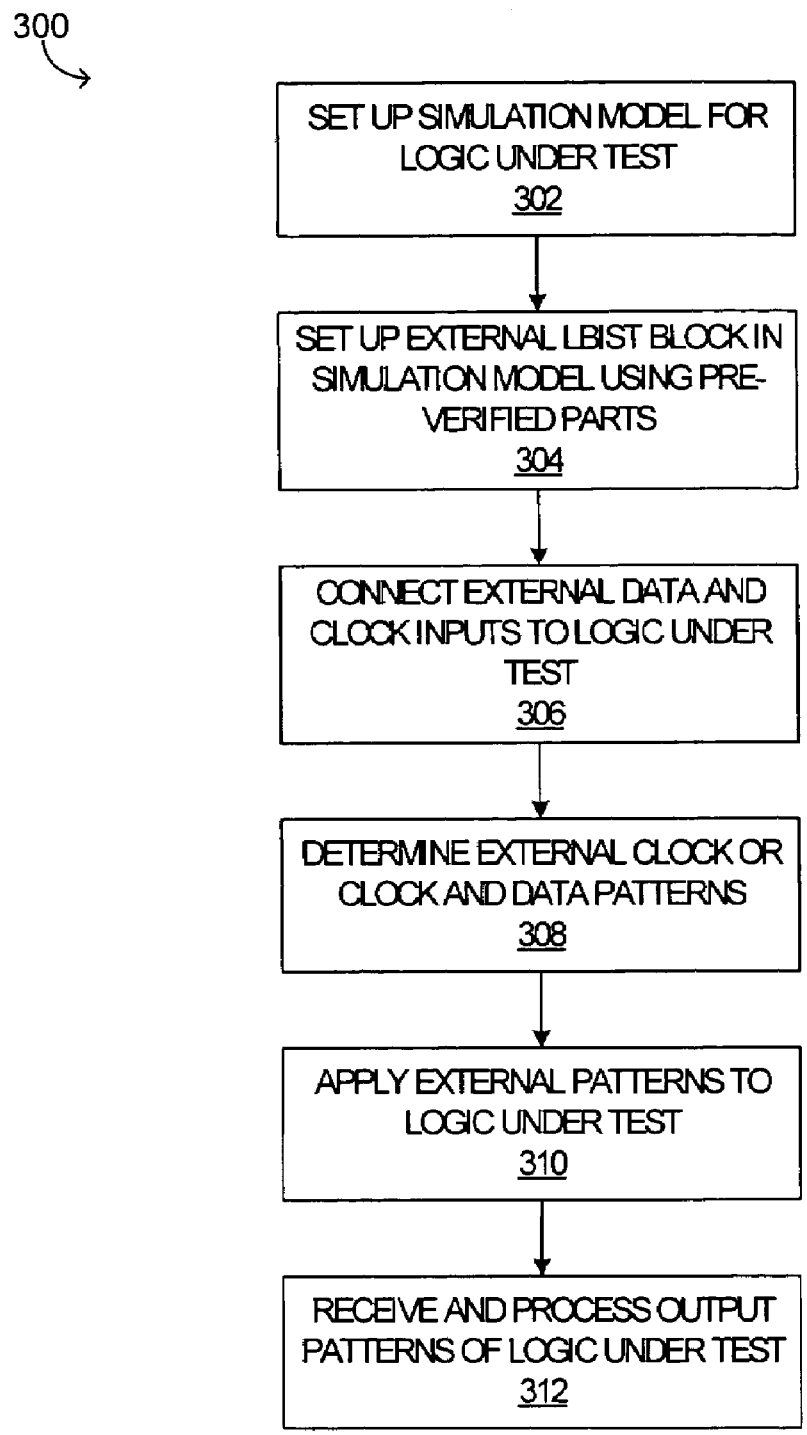
FIG. 3 is a flow chart depicting the process of generating external clock and data patterns for a test case through a modified method of TTP simulation.

FIG. 3 is a flow chart 300 depicting the process of generating external clock and data patterns for a test case through a modified method of TTP simulation. First, a user must set up a simulation model for the logic under test 302. Using pre-verified parts from the simulation model, the user sets up the external LBIST block 210 in the simulation model 304. The external data inputs 202 and clock inputs 204 connect to the logic under test in the simulation model 306. The user determines the external clock or external clock and data patterns to apply to the logic under test 308. As previously described, external pattern generation for TTP LBIST involves providing external clock patterns or providing external clock and data patterns to the logic under test. The simulator applies the external patterns to the logic under test 310. The user in conjunction with the simulator receives and processes the target output patterns of the logic under test 312. There can be a receiver block 108 from the LBIST satellite 0 102 to process the resulting target output patterns of the logic under test, or alternatively, a user can process the target results outside of the logic by externally scanning these results. From these target output patterns the user can determine if the logic is operating correctly.

It is understood that the present invention can take many forms and embodiments. Accordingly, several variations of the present design may be made without departing from the scope of the invention. The capabilities outlined herein allow for the possibility of a variety of networking models. This disclosure should not be read as preferring any particular networking model, but is instead directed to the underlying concepts on which these networking models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for applying external clock patterns and external data patterns for logic built-in self testing ("LBIST") in a simulator, comprising:
    setting up a simulation model in the simulator for a logic under test;
    setting up an external LBIST block in the simulation model, wherein the external LBIST block comprises pre-verified internal clock and pre-verified data pattern logic;
    connecting external clock inputs and external data inputs from the external LBIST block to the logic under test;
    determining the external clock patterns and the external data patterns to test the logic under test;
    applying the external clock patterns and the external data patterns to the logic under test; and
    receiving and processing output patterns from the logic under test, wherein the external LBIST block further comprises:
    at least one phase shift and spreader block ("PSSB");
    at least one pseudo-random pattern generator ("PRPG"); and
    at least one LBIST controller clock pattern generator, wherein the LBIST controller clock pattern generator is coupled to the at least one PSSB and the at least one PRPG.

2. The method of claim 1, wherein the step of applying the external clock patterns and the external data patterns comprises applying only the external clock patterns to the logic under test.

3. The method of claim 1, wherein the pre-verified internal clock and the pre-verified data pattern logic is the same as logic used for on-product clock generation ("OPCG").

4. The method of claim 1, wherein the at least one PSSB and the at least one PRPG are disabled when only the external clock patterns are provided to the logic under test.

5. The method of claim 1, wherein the step of receiving and processing output patterns further comprises configuring a receiver block in the simulation model for receiving and processing the output patterns.

6. The method of claim 1, wherein the step of receiving and processing output patterns further comprises:
    scanning the output patterns outside of the simulation model; and
    processing the output patterns outside of the simulation model.

* * * * *